(12) United States Patent
deVilliers et al.

(10) Patent No.: US 10,332,744 B2
(45) Date of Patent: Jun. 25, 2019

(54) METHOD FOR PATTERNING A SUBSTRATE USING A LAYER WITH MULTIPLE MATERIALS

(71) Applicant: Tokyo Electron Limited, Minato-ku, Tokyo (JP)

(72) Inventors: Anton J. deVilliers, Clifton Park, NY (US); Andrew W. Metz, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 13 days.

(21) Appl. No.: 15/581,708

(22) Filed: Apr. 28, 2017

(65) Prior Publication Data

US 2017/0316939 A1 Nov. 2, 2017

Related U.S. Application Data

(60) Provisional application No. 62/329,922, filed on Apr. 29, 2016.

(51) Int. Cl.
*H01L 21/033* (2006.01)
*H01L 21/311* (2006.01)
(Continued)

(52) U.S. Cl.
CPC ...... *H01L 21/0337* (2013.01); *H01L 21/0332* (2013.01); *H01L 21/0338* (2013.01);
(Continued)

(58) Field of Classification Search
None
See application file for complete search history.

(56) References Cited

U.S. PATENT DOCUMENTS 8,883,636 B2 * 11/2014 Wang ................. H01L 21/0337
257/E21.158
2010/0144150 A1 6/2010 Sills et al.
(Continued)

FOREIGN PATENT DOCUMENTS

TW 201437755 A 10/2014
TW 201546961 A 12/2015
(Continued)

OTHER PUBLICATIONS

PCT Search Report of International Application No. PCT/US2017/030110, dated Sep. 26, 2017, Korean Intellectual Property Office, Korea.
(Continued)

*Primary Examiner* — Stephanie P Duclair
(74) *Attorney, Agent, or Firm* — Oblon, McClelland, Maier & Neustadt, L.L.P

(57) ABSTRACT

Techniques herein include forming single or multi-layer mandrels and then forming one or more lines of material running along sidewalls of the mandrels. A relatively thin portion of mandrel material stretches from a base of mandrels to each other and underneath sidewall spacers and other fill materials, thereby forming a film of mandrel material over an underlying layer, which provides advantages with etch selectivity in a patterning process. Accordingly a multi-line layer is formed with materials having different etch resistivities to be able to selectively etch one or more of the materials to create features where specified. Etching using an etch mask positioned above or below this multi-line layer further defines a pattern that is transferred into an underlying layer.

20 Claims, 7 Drawing Sheets

(51) Int. Cl.
   *H01L 21/3205*   (2006.01)
   *H01L 21/3105*   (2006.01)
   *H01L 21/321*    (2006.01)

(52) U.S. Cl.
   CPC ...... *H01L 21/311* (2013.01); *H01L 21/31053* (2013.01); *H01L 21/321* (2013.01); *H01L 21/3205* (2013.01)

(56) References Cited

U.S. PATENT DOCUMENTS

| | | | |
|---|---|---|---|
| 2010/0144151 A1* | 6/2010 | Sills | G03F 7/40 438/694 |
| 2013/0122686 A1* | 5/2013 | Chang | H01L 21/02639 438/429 |
| 2013/0302981 A1 | 11/2013 | Millward et al. | |
| 2014/0127909 A1 | 5/2014 | Sipani et al. | |
| 2015/0243518 A1 | 8/2015 | deVilliers | |
| 2015/0243519 A1* | 8/2015 | deVilliers | H01L 21/0337 438/692 |

FOREIGN PATENT DOCUMENTS

| | | |
|---|---|---|
| TW | 201613103 A | 4/2016 |
| WO | 2010096363 A2 | 8/2010 |

OTHER PUBLICATIONS

Notification of Examination Opinions issued in corresponding Taiwanese Application No. 106114205 dated Jul. 27, 2018 (with English translation).

* cited by examiner

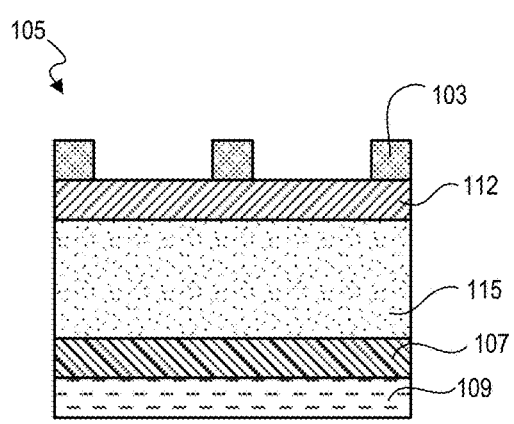
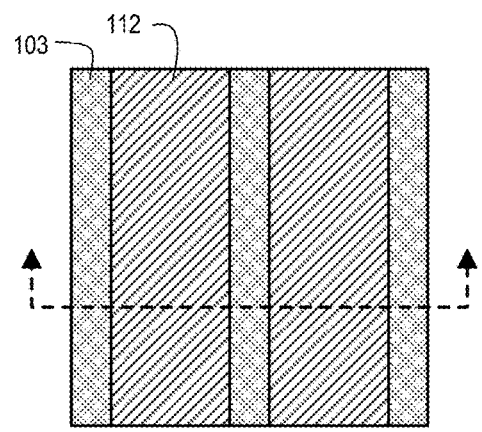
FIG. 1A
FIG. 1B
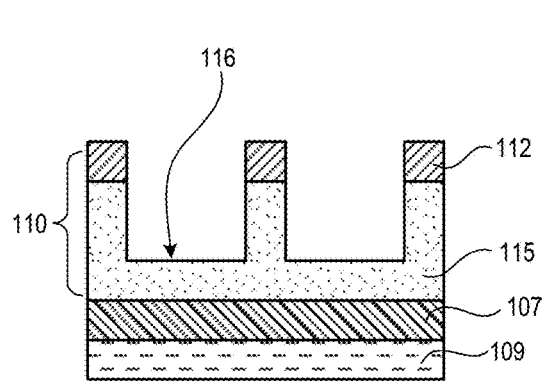
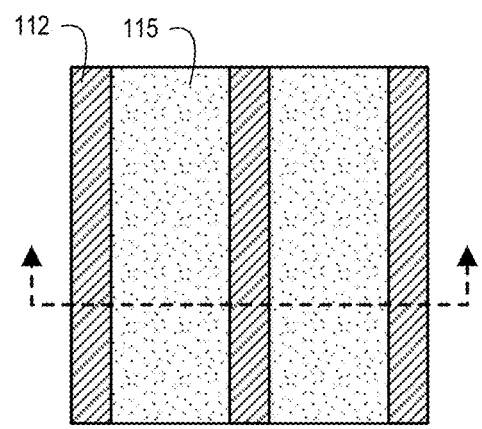
FIG. 2A
FIG. 2B
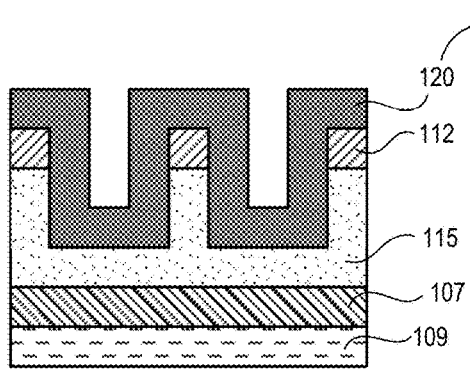
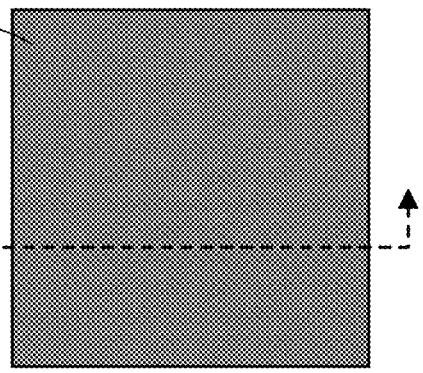
FIG. 3A
FIG. 3B

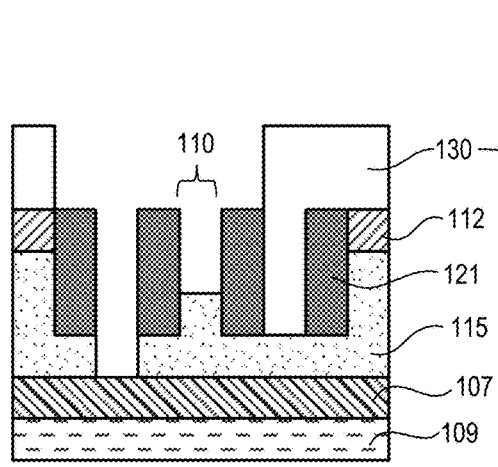
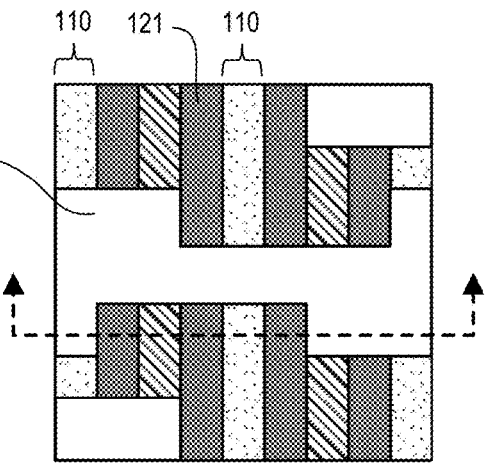
FIG. 7A  FIG. 7B
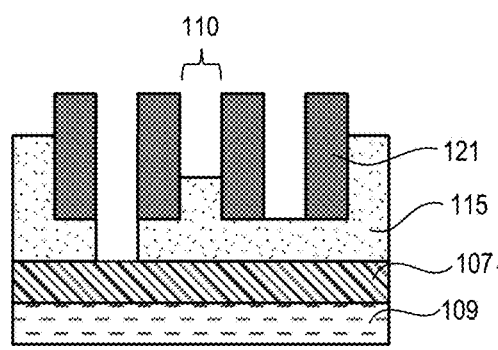
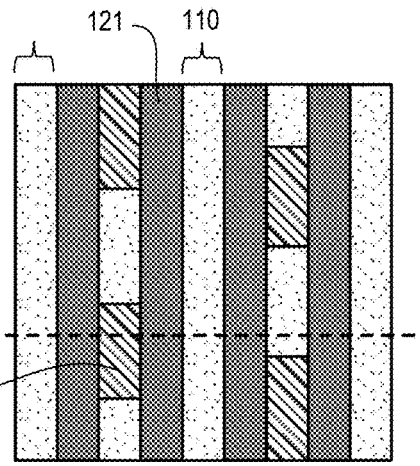
FIG. 8A  FIG. 8B
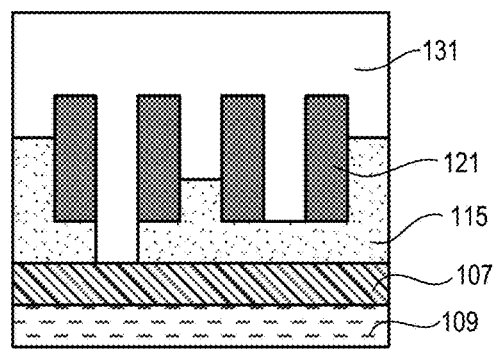
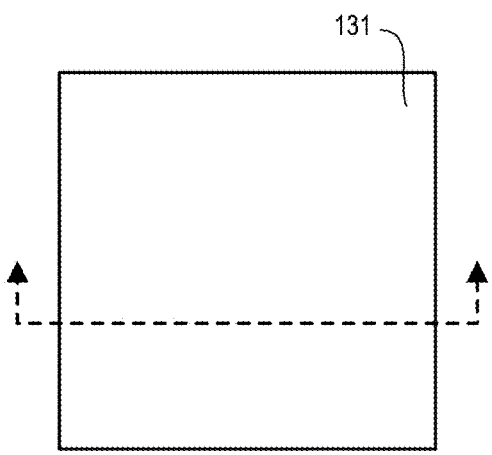
FIG. 9A  FIG. 9B

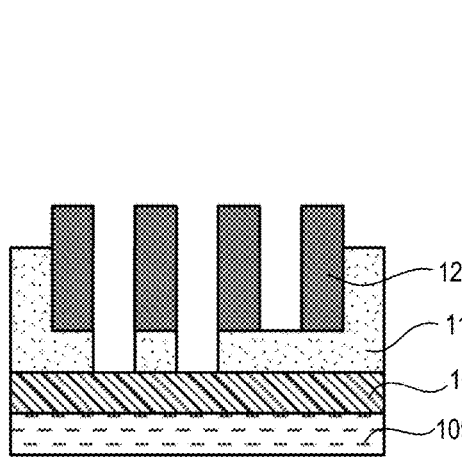 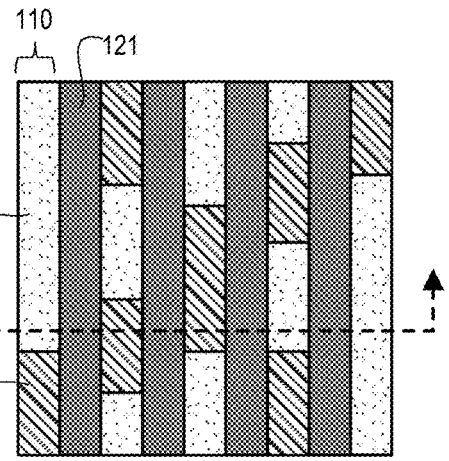
FIG. 13A  FIG. 13B
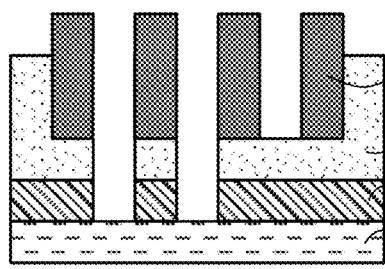 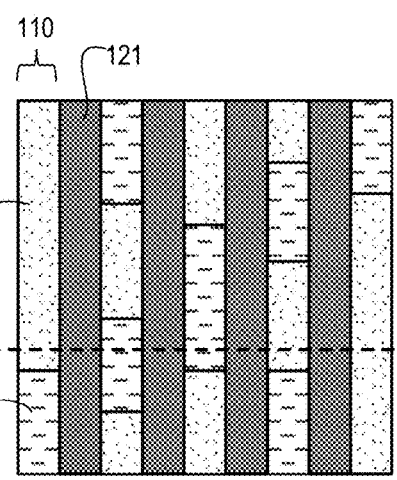
FIG. 14A  FIG. 14B
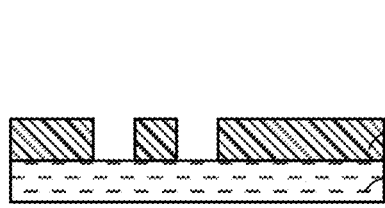 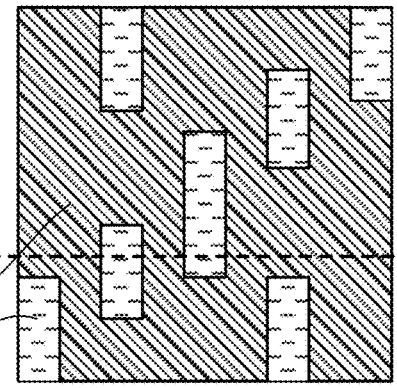
FIG. 15A  FIG. 15B

METHOD FOR PATTERNING A SUBSTRATE USING A LAYER WITH MULTIPLE MATERIALS

CROSS REFERENCE TO RELATED APPLICATIONS

The present application claims the benefit of U.S. Provisional Patent Application No. 62/329,922, filed on Apr. 29, 2016, entitled "Method for Patterning a Substrate Using a Layer with Multiple Materials," which is incorporated herein by reference in its entirety.

BACKGROUND OF THE INVENTION

This disclosure relates to substrate processing, and, more particularly, to techniques for patterning substrates including patterning semiconductor wafers.

Methods of shrinking line-widths in lithographic processes have historically involved using greater-NA optics (numerical aperture), shorter exposure wavelengths, or interfacial media other than air (e.g., water immersion). As the resolution of conventional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a relief pattern which can be used as an etch mask to transfer a pattern into an underlying layer on a substrate. Patterning of the radiation-sensitive material generally involves exposure of actinic radiation through a reticle (and associated optics) onto the radiation-sensitive material using, for example, a photolithography system. This exposure can then be followed by the removal of irradiated regions of the radiation-sensitive material (as in the case of positive photoresist), or non-irradiated regions (as in the case of negative resist) using a developing solvent. This mask layer can comprise multiple sub-layers.

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic techniques.

SUMMARY

Semiconductor technologies are continually progressing to smaller feature sizes including feature sizes of 14 nanometers, 7 nm, 5 nm, and below. This continual reduction in sizes of features from which various elements are fabricated places ever-greater demands on techniques used to form the features. The concept of "pitch" can be used to describe the sizing of these features. Pitch is the distance between the two identical points in two adjacent repetitive features. Half-pitch then is half the distance between identical features of an array.

Pitch reduction techniques, often somewhat erroneously yet routinely termed "pitch multiplication" as exemplified by "pitch doubling" etc., can extend the capabilities of photolithography beyond feature size limitations (optical resolution limitations). That is, conventional multiplication of pitch (more accurately pitch reduction or multiplication of pitch density) by a certain factor involves reducing a target pitch by a specified factor. Double patterning techniques used with 193 nm immersion lithography are conventionally considered as one of the most promising techniques to pattern 22 nm nodes and smaller. Noteworthy is that self-aligned spacer double patterning (SADP) has already been established as a pitch density doubling process and has been adapted in high volume manufacturing of NAND flash memory devices. Moreover, ultra-fine resolution can be obtained to repeat the SADP step twice as pitch quadrupling.

Although there exist several patterning techniques to increase pattern density or pitch density, conventional patterning techniques suffer from poor resolution or rough surfaces of etched features. Thus, conventional techniques cannot provide a level of uniformity and fidelity desired for very small dimensions (20 nm and smaller). Reliable lithographic techniques can produce features having a pitch of about 80 nm. Conventional and emerging design specifications, however, desire to fabricate features having critical dimensions less than about 20 nm or 10 nm. Moreover, with pitch density doubling and quadrupling techniques, sub-resolution lines can be created, but making cuts or connections between these lines is challenging, especially since the pitch and dimensions needed for such cuts is far below capabilities of conventional photolithography systems.

Techniques disclosed herein provide a method for pitch reduction (increasing pitch/feature density) for creating high-resolution features and also for cutting on pitch of sub-resolution features. Techniques herein include forming a bi-layer or multi-layer mandrels and then forming one or more lines of material running along sidewalls of the mandrels. The different materials can have different etch characteristics to be able to selectively etch one or more of the materials to create features and create cuts and blocks where specified. The multiple materials can be a pattern of alternating, sub-resolution lines, and each line can be preferentially etched relative to the other lines. Etching using an etch mask positioned above or below this multi-line layer further defines a pattern that is transferred into an underlying layer. Having a mandrel of two or more layers of material enables one of those materials to be sacrificial such as when etching a spin-on reversal overcoat material that has filled in open spaces, but leaves an overburden. One or more etched lines, combined with an etch mask, provide a combined etch mask defining sub-resolution features. Thus, methods herein provide a sequence of materials that provide selective self-alignment, such as for blocking or cutting. Combined with an underlying transfer layer or memorization layer, many different etch selectivities can be accessed for creating sub-resolution features.

One embodiment includes a method of patterning a substrate. Such a patterning method includes forming mandrels on a target layer of a substrate. The mandrels are comprised of at least two layers of material. The mandrels include a bottom layer of a first material, and a top layer of a second material. The target layer is comprised of a fifth material. Sidewall spacers are formed on sidewalls of the mandrels. The sidewall spacers are comprised of a third material. A fill material is deposited on the substrate that at least partially fills open spaces defined between the sidewall spacers. The fill material is comprised of a fourth material. The first material, the third material and the fourth material are all chemically different from each other. The second material and the fourth material have a same etch resistivity for a given etch chemistry. An etch process is executed that etches uncovered portions of the fill material and that etches uncovered portions of the top layer of the mandrels.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIGS. 1A-15A are cross-sectional side views of an example substrate segment showing a process flow according to embodiments disclosed herein.

FIGS. 1B-15B are top views of corresponding example substrate segments from FIGS. 1A-15A according to embodiments disclosed herein. The dotted sectional line indicates the cross section for corresponding cross-sectional side views.

FIGS. 16A-21A are cross-sectional side views of an example substrate segment showing a process flow according to embodiments disclosed herein.

FIGS. 16B-21B are top views of corresponding example substrate segments from FIGS. 16A-21A according to embodiments disclosed herein. The dotted sectional line indicates the cross section for corresponding cross-sectional side views.

DETAILED DESCRIPTION

Figure 4A:
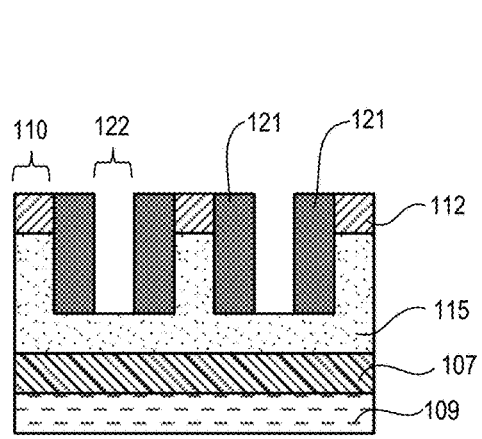

Techniques disclosed herein provide a method for pitch reduction (increasing pitch/feature density) for creating high-resolution features and also for cutting on pitch of sub-resolution features. Techniques herein include forming single, bi-layer, or multi-layer mandrels and then forming one or more lines of material running along sidewalls of the mandrels. Thus a multi-line layer is formed. The different materials can have different etch resistivities to be able to selectively etch one or more of the materials to create features and create cuts and blocks where specified. The multiple materials can be a pattern of alternating, sub-resolution lines, and each line can be preferentially etched relative to the other lines. Combined with one or more conventional etch masks, sub-resolution cuts and structures can be executed all while being self-aligned.

Mandrels can be formed from a given layer of material without completely etching through that layer, essentially leaving a mandrel material skin or film on the substrate. This remaining film provides patterning benefits. Etching using an etch mask positioned above or below this multi-line layer further defines a pattern that is transferred into an underlying layer. Having a mandrel of two or more layers of material enables one of those materials to be sacrificial such as when etching a spin-on reversal overcoat material that has filled-in open spaces, but leaves an overburden. One or more etched lines, combined with an etch mask, provide a combined etch mask defining sub-resolution features. Thus, methods herein provide a sequence of materials that provide selective self-alignment, such as for blocking or cutting. Combined with an underlying transfer layer or memorization layer, many different etch selectivities can be accessed for creating sub-resolution features.

Referring now to FIGS. 2A and 2B, one embodiment includes a method of patterning a substrate. Mandrels 110 are formed or provided on a target layer 107 of a substrate 105. Substrate 105 can include one or more underlying layers 109. The mandrels 110 can be comprised of at least two layers of material. The mandrels including a bottom layer 115 of a first material, and a top layer 112 of a second material. A film 116 of the first material can cover the target layer 107 between the mandrels 110 such that a top surface of the bottom layer of the mandrels is greater in height as compared to a top surface of the film 116 of the first material. The target layer 107 is comprised of a fifth material. Note that other interfacial films, coatings, and layers can be included to assist with micro fabrication. Also note that numerical modifiers of materials are merely labels and that a given two materials can be identical, chemically different, have same etch resistivities, or have different etch resistivities.

There are a few different ways of forming such multi-layer mandrels. Referring now to FIGS. 1A and 1B, bottom layer 115 can be deposited on substrate 105 using conventional deposition techniques such as spin-on deposition, physical vapor deposition, chemical vapor deposition, etc. After depositing bottom layer 115, top layer 112 can likewise be formed as a relatively planar and whole/uniform layer formed on top of bottom layer 115. With these two layers deposited, a relief pattern 103 can be formed on the substrate. Relief pattern 103 can be a photoresist that has been exposed and developed. Note that other coatings or layers (not shown) such as anti-reflective coatings can be used to assist with development of the relief pattern 103. After the relief pattern 103 is formed, this relief pattern can be used as an etch mask to form mandrels 110. An anisotropic etch can be executed to remove material not covered by the relief pattern 103. Using a directional etch results in forming (approximately) vertical sidewalls of the mandrels 110. Note that since top layer 112 and bottom layer 115 are different materials, different etch chemistries can be used to form the mandrels 110. FIG. 2A shows a result after a directional etch step. After forming the mandrels 110, relief pattern 103 can be removed. Executing an etch process to transfer relief pattern 103 into underlying layers and form mandrels can include transferring this relief pattern fully through the top layer 112 (second material) but only partially through uncovered portions of the first material without fully etching through the first material such that the film 116 of the first material is formed. After forming the mandrels 110, relief pattern 103 can be removed.

Figure 4B:
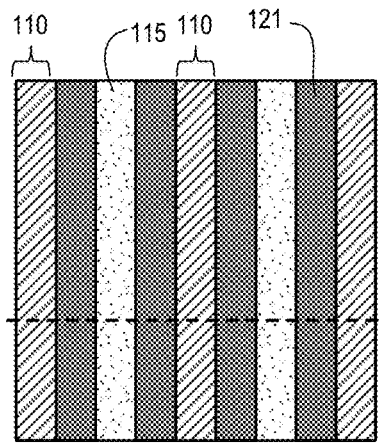

Referring now to FIGS. 4A and 4B, sidewall spacers 121 are formed on sidewalls of the mandrels 110. The sidewall spacers 121 are comprised of a third material. Sidewall spacers are generally lines of material that are formed to be in contact with sidewalls of the mandrels 110. Sidewall spacers can be formed by depositing a conformal film 120 on the substrate 105 as shown in FIGS. 3A and 3B. The conformal film 120 wraps around the mandrels 110 an provides a film having a relatively same thickness on both horizontal surfaces and vertical surfaces. A spacer etch process can be executed that directionally etches the conformal film 120 thereby removing the conformal film 120 from covering horizontal surfaces, except horizontal surfaces under sidewall (vertical surface) depositions. Thus open spaces 122 are defined between exposed (uncovered) vertical surfaces of sidewall spacers 121. Such open spaces results in the film of the first material being uncovered. The result is sidewall spacers 121 which follow a shape of mandrels 110. Note that mandrels 110 can be lines of material that are straight lines, curved lines, routed lines with bends, etc. Mandrels 110 can also be mesas, cylinders, etc. As is known in the microfabrication industry, a mandrel is generally a vertically protruding structure around which other structures can be formed, and typically has a rectangular cross section, though sidewalls can have various amounts of slope depending on materials used and formation process.

Figure 5A:
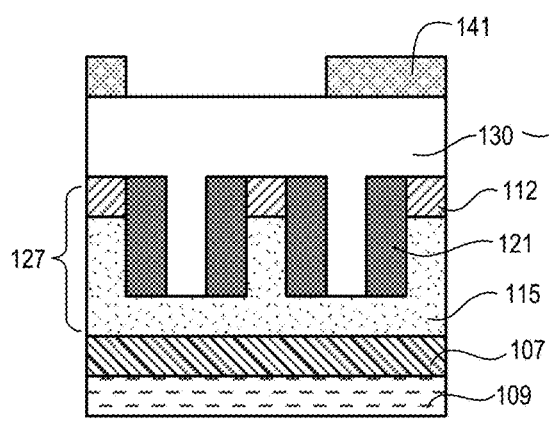
Figure 5B:
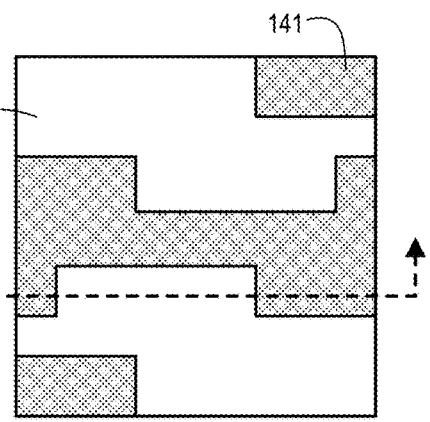

Referring now to FIGS. 5A and 5B, a fill material 130 is deposited on the substrate 105 that at least partially fills open spaces 122 defined between the sidewall spacers 121. The fill material 130 is comprised of a fourth material. Such fill material can be deposited by vapor deposition techniques or spin-on deposition techniques. Using spin-on deposition can be convenient for depositing such a fill material, but typically results as an overcoat deposition, leaving an overburden of material on the substrate 105. Note in FIG. 5A that the fill material 130 can cover the sidewall spacers 121 and the mandrels 110. The first material (bottom layer 115), the third material (sidewall spacers 121) and the fourth material (fill material 130) are all chemically different from each other in that each of these materials has a different etch resistivity for a given etch chemistry. The second material and the fourth material, however, have a same etch resistivity for a given etch chemistry. For example, the second material and the fourth material can be identical, or have similar etch properties for a particular etchant. By way of a non-limiting example, the second material can be amorphous carbon while the fourth material is spin-on carbon.

Underneath the overcoat of fill material 130, the substrate essentially now provides multiple lines of material of different etch resistivities as a multi-line layer 127. Note that in this particular example there is a repeating pattern of A-B-C-B-A-B-C-B for the different materials of the multi-line layer as viewed from the top. Sidewall spacers 121 have an even distribution and then areas between sidewall spacers 121 are occupied alternately by mandrels 110 and fill material 130. An etch mask 141 is deposited on the substrate.

Figure 6A:
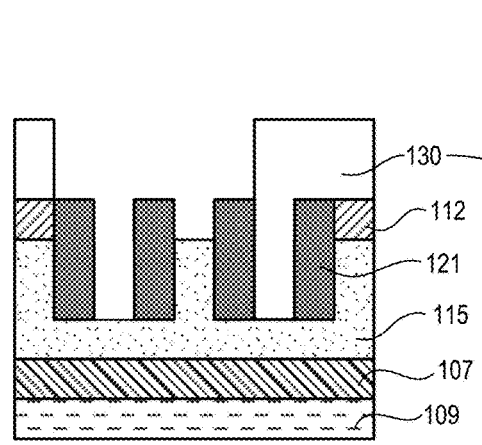
Figure 6B:
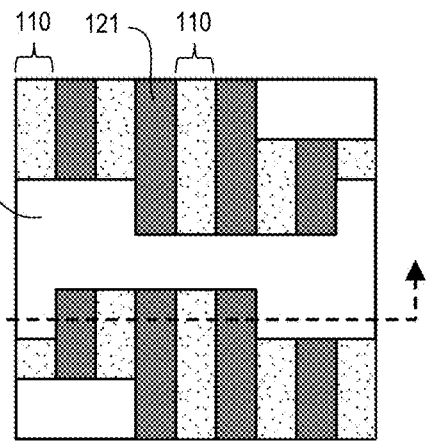

Referring now to FIGS. 6A and 6B, a first etch process is executed that etches uncovered portions of the fill material and that etches uncovered portions of the top layer of the mandrels. In this particular example, the uncovered portions are defined by openings of the etch mask 141 (where there is no etch mask). A given etch chemistry selected etches fill material 130. Initially the overburden is removed, thereby uncovering sidewall spacers 121 and top layer 112. With sidewall spacers having a different etch resistivity, sidewall spacers resist being etched. Top layer 112, however, can have a same etch resistivity as fill material 130 and thus can be etched away with fill material 130. In some embodiments, at least a portion of the fill material and the top layer are simultaneously etched. A same etch chemistry can be used to etch the fourth material and the second material. The result is that bottom layer 115 of the mandrels 110 is now uncovered.

Referring now to FIGS. 7A and 7B, a second etch process is executed that etches uncovered portions of the film of the first material until reaching the target layer and that partially etches uncovered portions of the bottom layer of the mandrels such that the uncovered portions of the bottom layer of the mandrels remain covering the target layer. In other words, the first material between spacers is etched, while the mandrels formed of the first material and being taller are not completely etched. The fill material 130 and etch mask materials can then be removed, as shown in FIGS. 8A and 8B. In other words, the mandrel material skin or film (which can be considered as anti-mandrels by location) is removed, while leaving most of the mandrels. Thus, in one embodiment, a first relief pattern is formed on the substrate subsequent to depositing the fill material and prior to executing the first etch process and the second etch process. The first relief pattern defines openings that uncover portions of the substrate, wherein the first etch process and the second etch process use the first relief pattern as an etch mask.

Figure 10A:
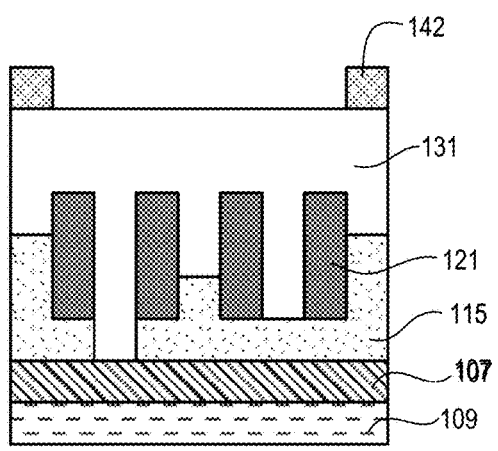
Figure 10B:
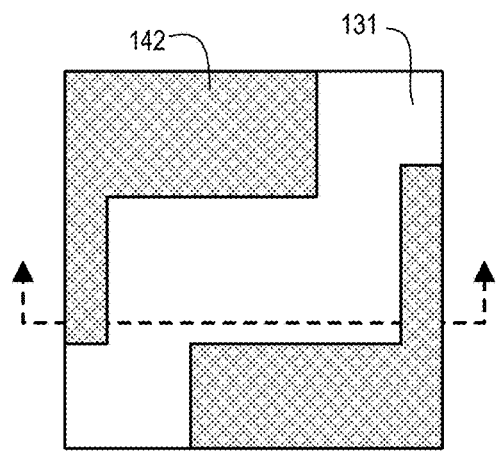
Figure 11A:
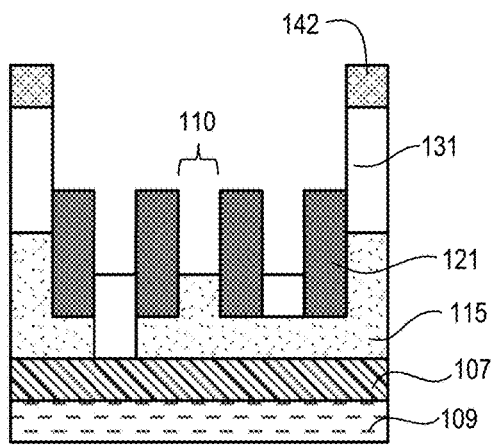
Figure 11B:
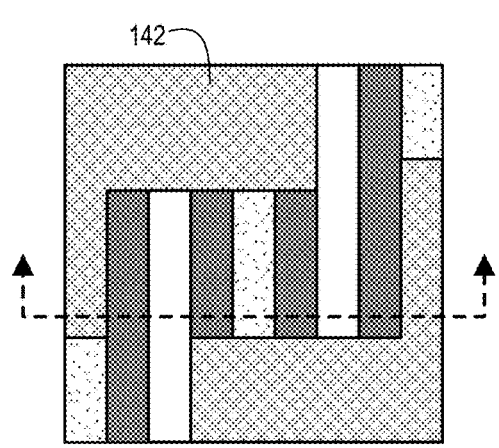

Alternatively, subsequent to or prior to executing the etch process, a chemical-mechanical polishing step can be executed that uses the bottom layer of the mandrels as a planarization stop material layer. The chemical-mechanical polishing step removes the third material above a top surface of the bottom layer of the mandrels Referring now to FIGS. 11A and 11B, a third etch process is executed using a second relief pattern formed on the substrate, such as with etch mask 142, as shown in FIGS. 10A and 10B. Prior to forming etch mask 142, fill material 131 can be deposited on the substrate to planarize the substrate sufficient to photolithographically form the second relief pattern, as illustrated in FIGS. 9A and 9B. The third etch process etches uncovered portions of the fill material at least down to the top surface of the bottom layer of the mandrels, an example result is shown in FIGS. 11A and 11B.

Figure 12A:
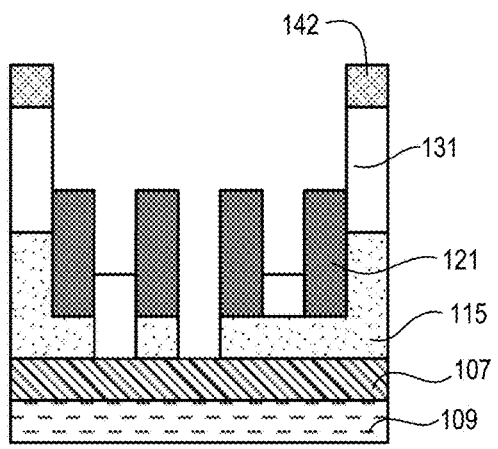
Figure 12B:
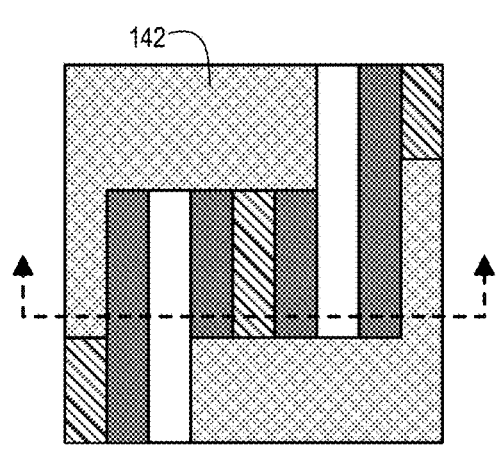

Referring now to FIGS. 12A and 12B, a fourth etch process is executed that etches uncovered portions of the bottom layer of the mandrels until reaching the target layer. Remaining fill material can be removed, as shown in FIGS. 13A and 13B.

Referring now to FIGS. 14A and 14B, a fifth etch process can be executed using the spacers, remaining mandrels, and remaining film of the first material as an etch mask to transfer a combined pattern into the target layer 107. FIGS. 15A and 15B illustrate the target layer 107 being patterned after removal of overlying layers.

There are various alternative and additional patterning steps that can be optionally selected. Embodiments can include forming a patterned hardmask layer on the substrate prior to forming the mandrels, prior to forming the sidewall spacers, and prior to depositing the fill material. The patterned hardmask layer defining an etch mask, and the patterned hardmask layer positioned above the target layer. Executing this etch process can include transferring a combined pattern into the target layer, the combined pattern defined by the sidewall spacers, the mandrels, and the patterned hardmask layer, the patterned hardmask layer defining openings that span across two or more sidewall spacers. The mandrels can be formed by depositing the bottom layer on the substrate, depositing the top layer on the bottom layer, and anisotropically etching through the top layer and the bottom layer using a same etch mask pattern.

At least a portion of the fill material and the top layer can be simultaneously etched, and wherein a same etch chemistry can be used to etch the fourth material and the second material.

The first material, the third material and the fourth material can all be chemically different from each other by having different etch resistivities relative to each other. Note that some materials can be a same compound, but with different etch resistivities depending on structural arrangement. The first material, the third material the fourth material, and the fifth material can all be chemically different from each other by having different etch resistivities relative to each other.

In other embodiments, forming the sidewall spacers can include forming first sidewall spacers on exposed sidewalls of the mandrels, and then forming second sidewall spacers on exposed sidewalls of the first sidewall spacers. The second sidewall spacers having a different etch resistivity relative to the first sidewall spacers. The mandrels can include a middle layer of a sixth material, the middle layer positioned above the bottom layer and below the top layer, the sixth material having a different etch resistivity relative to the first material and the second material.

Figure 16A:
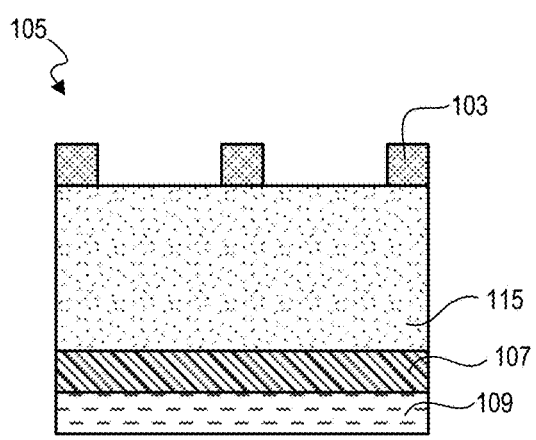
Figure 16B:
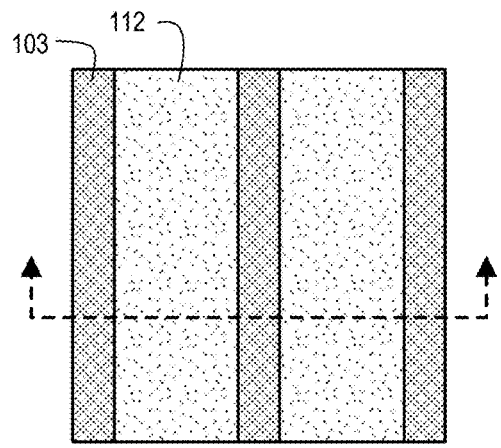
Figure 17A:
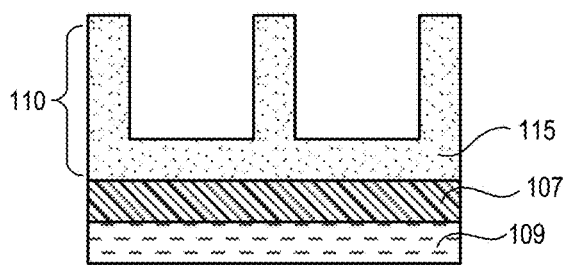
Figure 17B:
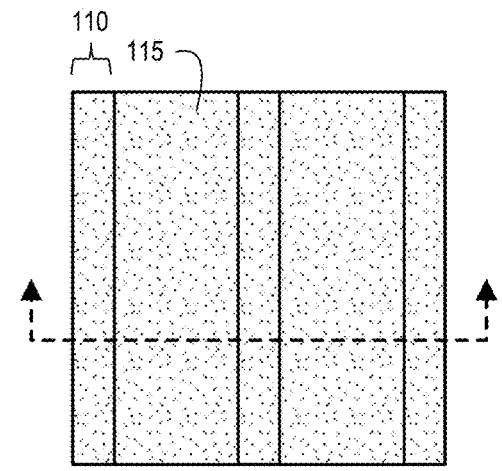

An alternative embodiment is illustrated in FIGS. 16A-21A and 16B-21B. FIGS. 16A and 16B are similar to FIGS. 1A and 1B except that only one material is deposited to form mandrels. Mandrels 110 are formed by partially etching bottom layer 115 without completely etching through the layer of first material. Thus mandrels are formed from a layer of a first material while remaining portions of the first material still cover target layer 107, as illustrated in FIGS. 17A and 17B.

Figure 18A:
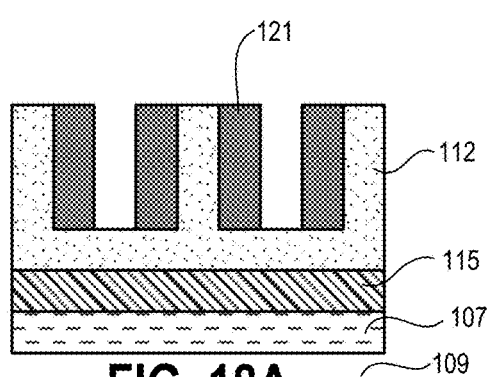
Figure 18B:
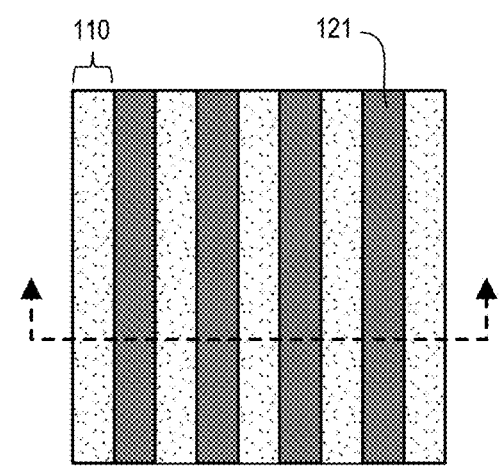

Sidewall spacers 121 are formed on sidewalls of the mandrels. The sidewall spacers are comprised of a third material. The sidewall spacers define open spaces between each other that leave portions of the first material uncovered and tops of the mandrels uncovered. An example result is shown in FIGS. 18A and 18B.

Figure 19A:
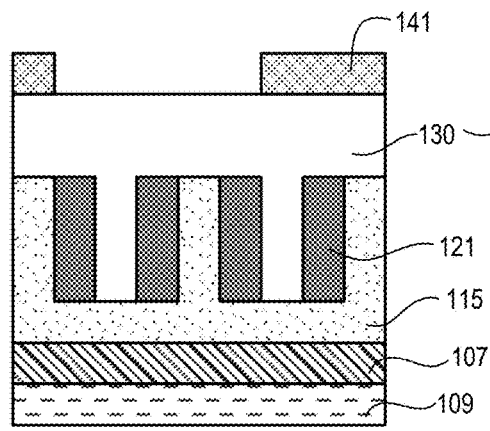
Figure 19B:
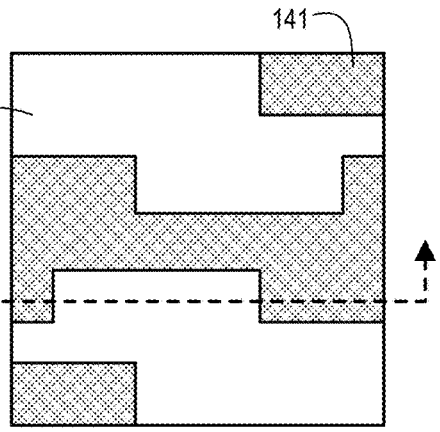
Figure 20A:
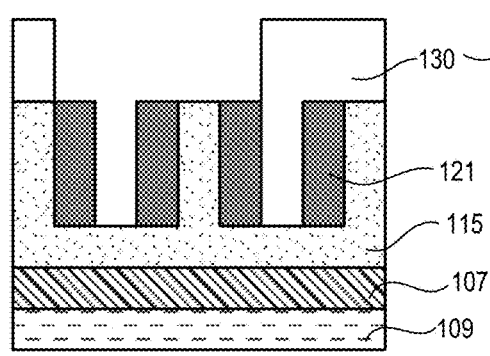
Figure 20B:
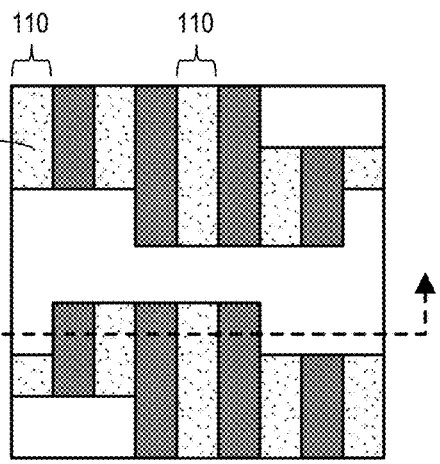
Figure 21A:
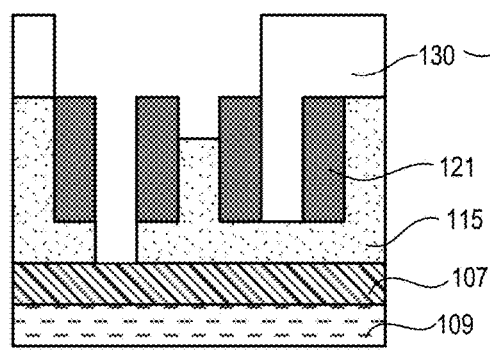
Figure 21B:
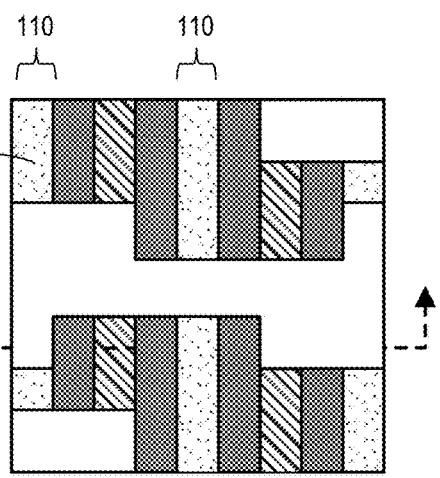

Referring now to FIGS. 19A and 19B, a fill material 130 can be deposited on the substrate, followed by forming an etch mask 141. Uncovered portions of the fill material can be etched (FIGS. 20A and 20B), followed by etching uncovered portions of the first material without completely etching mandrels. Process flow can then continue similar to FIGS. 8A and 8B to FIGS. 15A and 15B.

Alternative embodiments include first forming a hardmask layer on the substrate and then forming the multi-line layer on top of the hardmask layer. For example, a patterned hardmask layer is formed on a substrate. The patterned hardmask layer includes hardmask materials that masks a portion of an underlying layer. The patterned hardmask layer includes a fill material that fills a remaining portion of the patterned hardmask layer. The fill material has a different etch resistivity relative to the hardmask material. Mandrels are formed on the patterned hardmask layer, with the mandrels being comprised of at least two layers of material. The mandrels include a bottom layer of a first material, and a top layer of a second material. A film of the first material covers the target layer between the mandrels such that a top surface of the bottom layer of the mandrels is greater in height as compared to a top surface of the film of the first material. Sidewall spacers are formed on sidewalls of the mandrels. The sidewall spacers are comprised of a third material. The sidewall spacers define open spaces between exposed sidewalls of the sidewall spacers that leave the film of the first material uncovered. An etch process is executed that etches uncovered portions of the first material without completely etching mandrels.

Accordingly, a self-aligned mandrel and anti-mandrel blocks can be created/etched with no metal etches until a target layer such as a TiN hardmask open etch.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of patterning a substrate, the method comprising:
    forming mandrels on a target layer of a substrate, the mandrels being comprised of at least two layers of material, the mandrels including a bottom layer of a first material, and a top layer of a second material, wherein a film of the first material covers the target layer between the mandrels such that a top surface of the bottom layer of the mandrels is greater in height as compared to a top surface of the film of the first material, the target layer being comprised of a fifth material;
    forming sidewall spacers on sidewalls of the mandrels, the sidewall spacers being comprised of a third material, the sidewall spacers defining open spaces between each other that leave the film of the first material uncovered;

depositing a fill material on the substrate that at least partially fills the open spaces defined between the sidewall spacers, the fill material being comprised of a fourth material, wherein the first material, the third material and the fourth material are all chemically different from each other, and wherein the second material and the fourth material have a same etch resistivity for a particular etch chemistry;

executing a first etch process that etches uncovered portions of the fill material and that etches uncovered portions of the top layer of the mandrels; and executing a chemical-mechanical polishing process, using the bottom layer of the mandrels as a planarization stop material layer, to remove the third material above a top surface of the bottom layer of the mandrels.

2. The method of claim 1, further comprising, executing a second etch process that etches uncovered portions of the film of the first material until reaching the target layer and that partially etches uncovered portions of the bottom layer of the mandrels such that the uncovered portions of the bottom layer of the mandrels remain covering the target layer.

3. The method of claim 2, further comprising forming a first relief pattern on the substrate subsequent to depositing the fill material and prior to executing the first etch process and the second etch process, the first relief pattern defining openings that uncover portions of the substrate, wherein the first etch process and the second etch process use the first relief pattern as an etch mask.

4. The method of claim 3, further comprising executing a third etch process using a second relief pattern formed on the substrate, the third etch process that etches uncovered portions of the fill material at least down to the top surface of the bottom layer of the mandrels.

5. The method of claim 4, further comprising executing a fourth etch process that etches uncovered portions of the bottom layer of the mandrels until reaching the target layer.

6. The method of claim 5, further comprising:
removing remaining fill material; and
executing a fifth etch process using the sidewall spacers, remaining mandrels, and remaining film of the first material as an etch mask to transfer a combined pattern into the target layer.

7. The method of claim 1, wherein forming mandrels includes:
depositing a layer of the first material on the target layer;
depositing a layer of the second material on the layer of first material;
forming a third relief pattern on the layer of the second material, the third relief pattern defining mandrel locations; and
executing a fifth etch process that uses the third relief pattern as an etch mask, the fifth etch process transferring the third relief pattern fully through the uncovered portions of the second material and partially through uncovered portions of the first material without fully etching through the first material such that the film of the first material is formed.

8. The method of claim 1, wherein the chemical-mechanical polishing process is executed after the first etch process.

9. The method of claim 1, wherein the chemical-mechanical polishing process is executed before the first etch process.

10. The method of claim 1, further comprising, executing a second etch process that etches uncovered portions of the bottom layer of the mandrels using an second etch mask.

11. The method of claim 1, further comprising, forming a patterned hardmask layer on the substrate prior to forming the mandrels, prior to forming the sidewall spacers, and prior to depositing the fill material, the patterned hardmask layer defining an etch mask, the patterned hardmask layer positioned above the target layer.

12. The method of claim 11, wherein executing the first etch process includes transferring a combined pattern into the target layer, the combined pattern defined by the sidewall spacers, the mandrels, and the patterned hardmask layer, the patterned hardmask layer defining openings that span across two or more sidewall spacers.

13. The method of claim 11, further comprising, executing a second etch process that etches uncovered portions of the bottom layer of the mandrels, wherein executing the second etch process includes transferring a second combined pattern into the target layer, the second combined pattern defined by the sidewall spacers, the fill material, and the patterned hardmask layer, the patterned hardmask layer defining openings that span across two or more sidewall spacers.

14. The method of claim 1, wherein the mandrels are formed by depositing the bottom layer on the substrate, depositing the top layer on the bottom layer, and anisotropically etching through the top layer and the bottom layer using a same etch mask pattern; and wherein at least a portion of the fill material and the top layer are simultaneously etched, and wherein a same etch chemistry is used to etch the fourth material and the second material.

15. The method of claim 1, wherein the first material, the third material and the fourth material are all chemically different from each other by having different etch resistivities relative to each other.

16. The method of claim 15, wherein the first material, the third material the fourth material, and the fifth material are all chemically different from each other by having different etch resistivities relative to each other.

17. The method of claim 1, wherein forming the sidewall spacers includes forming first sidewall spacers on exposed sidewalls of the mandrels, and then forming second sidewall spacers on exposed sidewalls of the first sidewall spacers, the second sidewall spacers having a different etch resistivity relative to the first sidewall spacers.

18. The method of claim 1, wherein the mandrels include a middle layer of a sixth material, the middle layer positioned above the bottom layer and below the top layer, the sixth material having a different etch resistivity relative to the first material and the second material.

19. A method of patterning a substrate, the method comprising:
forming a patterned hardmask layer on a substrate, the patterned hardmask layer including hardmask material that masks a portion of an underlying layer, the patterned hardmask layer including a fill material that fills a remaining portion of the patterned hardmask layer, the fill material having a different etch resistivity relative to the hardmask material;
forming mandrels on the patterned hardmask layer, the mandrels being comprised of at least two layers of material, the mandrels including a bottom layer of a first material, and a top layer of a second material, wherein a film of the first material covers the target layer between the mandrels such that a top surface of the bottom layer of the mandrels is greater in height as compared to a top surface of the film of the first material;
forming sidewall spacers on sidewalls of the mandrels, the sidewall spacers being comprised of a third material, the sidewall spacers defining open spaces between exposed sidewalls of the sidewall spacers that leave the film of the first material uncovered; and executing an etch process that etches uncovered portions of the first material without completely etching mandrels.

20. A method of patterning a substrate, the method comprising:

forming mandrels on a target layer of a substrate, the mandrels being formed by depositing a layer of first material on the substrate and using a mandrel etch mask to anisotropically etch partially into the layer of first material without completely etching through the layer of first material resulting in mandrels formed from the first material with the first material still covering the target layer between the mandrels;

forming sidewall spacers on sidewalls of the mandrels, the sidewall spacers being comprised of a third material, the sidewall spacers defining open spaces between each other that leave portions of the first material uncovered and tops of the mandrels uncovered;

depositing a fill material on the substrate that fills the open spaces defined between the sidewall spacers, the fill material being comprised of a fourth material, wherein the first material, the third material and the fourth material all have different etch resistivities relative to each other for a particular etch chemistry;

executing a first etch process that uses a first etch mask and etches uncovered portions of the fill material;

executing a chemical-mechanical polishing process to remove the third material above a top surface of the mandrels; and executing a second etch process that uses the first etch mask and etches uncovered portions of the first material between sidewall spacers resulting in the target layer being uncovered while only partially etching uncovered mandrels.

* * * * *